United States Patent
Smith

(10) Patent No.: US 7,864,085 B2
(45) Date of Patent: Jan. 4, 2011

(54) DATA COMPRESSION METHOD AND APPARATUS

(75) Inventor: Paul Henry Chandler Smith, Fort Collins, CO (US)

(73) Assignee: LSI Corporation, Milpitas, CA (US)

( * ) Notice: Subject to any disclaimer, the term of this patent is extended or adjusted under 35 U.S.C. 154(b) by 39 days.

(21) Appl. No.: 12/365,975

(22) Filed: Feb. 5, 2009

(65) Prior Publication Data
US 2010/0194607 A1   Aug. 5, 2010

(51) Int. Cl.
*H03M 7/00* (2006.01)
(52) U.S. Cl. .......................................... 341/106; 341/51
(58) Field of Classification Search ................ 341/50, 341/51, 106, 107, 87; 710/68
See application file for complete search history.

(56) References Cited

U.S. PATENT DOCUMENTS

| | | | |
|---|---|---|---|
| 4,558,302 A | 12/1985 | Welch | |
| 6,345,307 B1 * | 2/2002 | Booth | 709/247 |
| 6,415,061 B1 * | 7/2002 | Benayoun et al. | 382/253 |
| 6,876,774 B2 * | 4/2005 | Satoh et al. | 382/245 |

* cited by examiner

*Primary Examiner*—Brian Young

(57) ABSTRACT

Embodiments of the invention include a dictionary based data compression method, apparatus and system that is not based on either the LZ77 compression algorithm or the LZ78 compression algorithm, but includes many features of the LZW compression algorithm. The data compression method includes creating a mapping table of the messages in the alphabet of messages to a corresponding plurality of codewords, maintaining a dictionary including a mapping table of a first codeword and a second codeword to a new codeword, reading an input ensemble including a plurality of messages, converting the messages to an input codeword using the mapping table, and outputting the converted codewords as an output ensemble of compressed data. Unlike conventional data compression methods, the dictionary is generated from the output ensemble only, and is not based on any input messages. Therefore, the dictionary more quickly builds to define longer sequences of messages compared to conventional data compression methods.

17 Claims, 8 Drawing Sheets

FIG. 3

| FIG. 3(1) |
|-----------|
| FIG. 3(2) |
| FIG. 3(3) |

FIG. 3(1)

| $c_{in}$ | $p_1$ | $p_2$ | OUTPUT ($c_{out}$) | DICTIONARY ACTIVITY | | |
|---|---|---|---|---|---|---|
| 0 | 0 | – | | | | |
| 7 | 0 | 7 | | | | |
| 9 | – | – | 0,7,9 | 0,7 → 256 | 7,9 → 257 | |
| 7 | 7 | – | | | | |
| 7 | 7 | 7 | | | | |
| 9 | 7 | 257 | | | | |
| 7 | – | – | 7,257,7 | 9,7 → 258 | 7,257 → 259 | 257,7 → 260 |
| 4 | 4 | – | | | | |
| 7 | 4 | 7 | | | | |
| 0 | – | – | 4,7,0 | 7,4 → 261 | 4,7 → 262 | 7,0 → 263 |
| 7 | 7 | – | | | | |
| 0 | 263 | – | | | | |
| 7 | 263 | 7 | | | | |
| 7 | – | – | 263,7,7 | 0,263 → 264 | 263,7 → 265 | 7,7 → 266 |
| 7 | 7 | – | | | | |
| 6 | 7 | 6 | | | | |
| 7 | – | – | 7,6,7 | 7,6 → 267 | 6,7 → 268 | |
| 2 | 2 | – | | | | |
| 7 | 2 | 7 | | | | |
| 8 | – | – | 2,7,8 | 7,2 → 269 | 2,7 → 270 | 7,8 → 271 |
| 5 | 5 | – | | | | |
| 7 | 5 | 7 | | | | |
| 2 | 5 | 269 | | | | |
| 7 | – | – | 5,269,7 | 8,5 → 272 | 5,269 → 273 | 268,7 → 274 |
| 5 | 5 | – | | | | |
| 9 | 5 | 9 | | | | |
| 7 | 5 | 258 | | | | |
| 9 | – | – | 5,258,9 | 7,5 → 275 | 5,258 → 276 | 258,9 → 277 |

FIG. 3(2)

| | | | | | | |
|---|---|---|---|---|---|---|
| 7 | 7 | | | | | |
| 9 | 257 | | | | | |
| 7 | 260 | | | | | |
| 7 | 260 | 7 | | | | |
| 9 | 260 | 257 | | | | |
| 7 | 260 | 260 | | | | |
| 7 | - | - | 260,260,7 | 9,268 → 278 | 260,260 → 279 | 260,7 → 280 |
| 7 | 7 | - | | | | |
| 9 | 257 | - | | | | |
| 7 | 260 | - | | | | |
| 7 | 280 | - | | | | |
| 6 | 280 | 267 | | | | |
| 7 | - | - | 280,267,7 | 7,280 → 281 | 280,267 → 282 | 267,7 → 283 |
| 8 | 8 | - | | | | |
| 7 | 8 | 7 | | | | |
| 7 | 8 | 266 | | | | |
| 2 | - | - | 8,266,2 | 7,8 ALREADY IN DICTIONARY | 8,266 → 284 | 266,2 → 285 |
| 7 | 7 | - | | | | |
| 8 | 271 | - | | | | |
| 7 | 271 | 7 | | | | |
| 9 | 271 | 257 | | | | |
| 7 | 271 | 260 | | | | |
| 7 | 271 | 280 | | | | |
| 0 | - | - | 271,280,0 | 2,271 → 286 | 271,280 → 287 | 280,0 → 288 |

FIG. 3(3)

| | | | | |
|---|---|---|---|---|
| 3 | 3 | – | | |
| 7 | 3 | 7 | | |
| 7 | 3 | 266 | | |
| 9 | – | – | 3,266,9 | 0,3 → 289    3,266 → 290    266,9 → 291 |
| 7 | 7 | – | | |
| 7 | 266 | – | | |
| 7 | 266 | 7 | | |
| 9 | 266 | 257 | | |
| 7 | 266 | 260 | | |
| 7 | 266 | 280 | | |
| 7 | – | – | 266,280,7 | 9,266 → 292    266,280 → 293    280,7 → 294 |
| 6 | 6 | – | | |
| 7 | 268 | – | | |
| 4 | 268 | 4 | | |
| 7 | 268 | 262 | | |
| 2 | – | – | 268,262,2 | 7,268 → 295    268,262 → 296    262,2 → 297 |
| 7 | 7 | – | | |
| 8 | 271 | – | | |
| 7 | 271 | 7 | | |
| 9 | 271 | 257 | | |
| 7 | 271 | 260 | | |
| 7 | 287 | – | | |
| 0 | 287 | 0 | | |
| 3 | 287 | 289 | | |
| 8 | – | – | 287,289,8 | 2,287 → 298    287,289 → 299    289,8 → 300 |
| 0 | 0 | | | |
| 3 | 289 | | | |
| 15 | 289 | 15 | | |
| | | | 289,15 | |

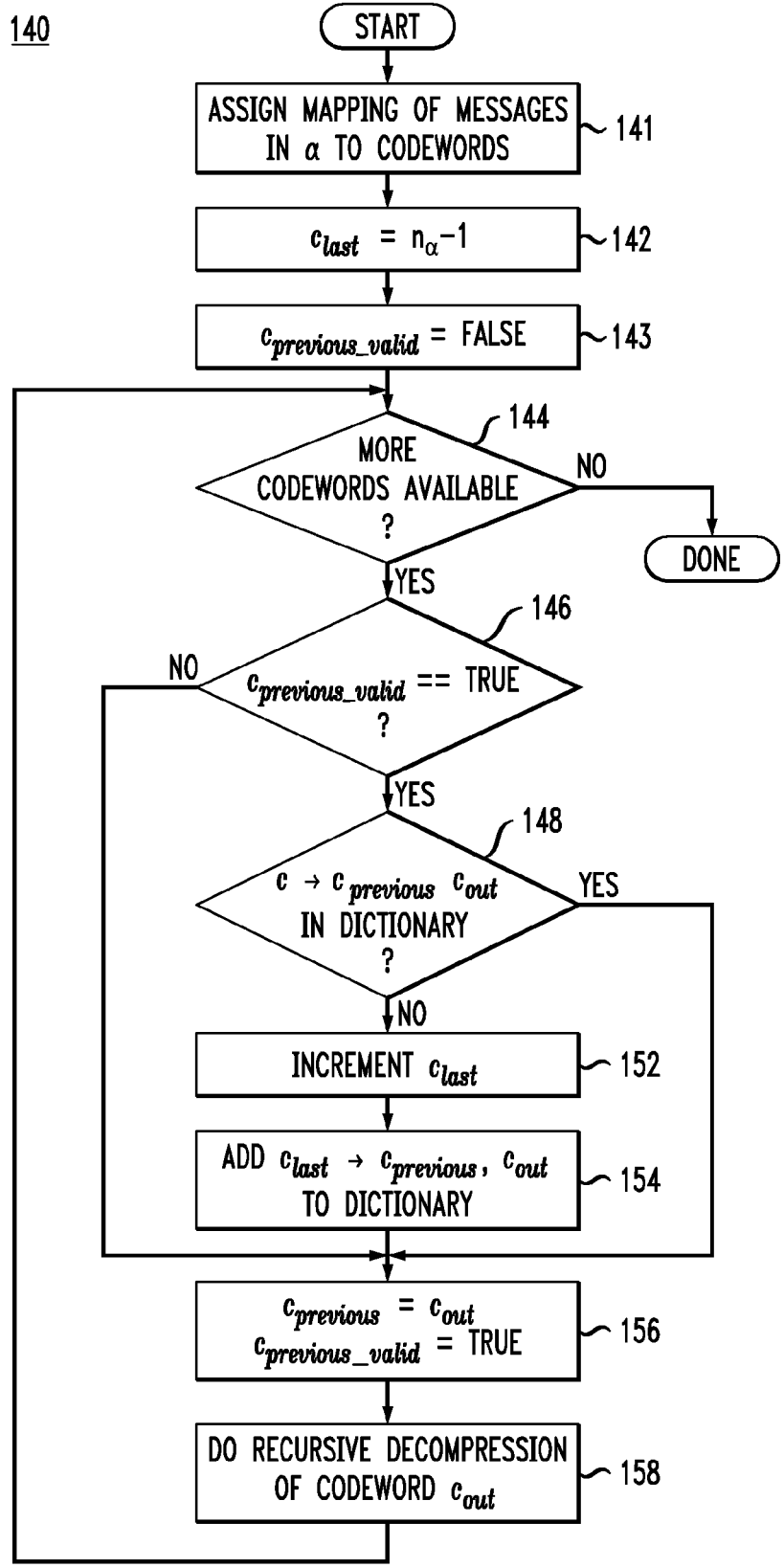

DATA COMPRESSION METHOD AND APPARATUS

BACKGROUND OF THE INVENTION

1. Field of the Invention

The invention relates to data compression. More particularly, the invention relates to dictionary methods and apparatus that perform lossless data compression.

2. Description of the Related Art

Lossless data compression relates to a category of data compression methods in which the recreated or reproduced (decompressed) data is an exact replication of the original data. Lossless data compression is compared with lossy data compression, in which the recreated data is different form the original data, i.e., there is some distortion between the original data and the recreated data.

Lossless data compression can be broken down into four categories: defined word compressors, the algebraic compressor, context aware compressors, and dictionary compressors. Defined word compressors operate by attempting to find an optimal mapping between messages and codewords such that the number of symbols in each codeword matches the information content of the message. The algebraic compressor is a distinct compression algorithm that operates by calculating a single unique number (represented by an arbitrarily long bit sequence) based on the probabilities of the individual messages. Context aware compressors operate by taking advantage of previously obtained or derived knowledge of an ensemble to represent the ensemble in a more compact form.

Dictionary compressors operate by combining groups of messages together into new messages to create a new ensemble with higher information entropy and shorter length. That is, as a bit stream is read, a collection of bit patterns encountered in the bit stream (a "dictionary") is compiled. When a previously encountered bit pattern is seen in the bit stream, a dictionary code identifying an entry in the dictionary corresponding to the bit pattern, rather than the bit pattern itself, is substituted in the bit stream. The dictionary code usually is represented by a number of bits that is less than the number of bits in the bit pattern that the dictionary code identifies. Thus, significant saving in storage space or transmission time can be realized, especially in a binary image where repetition of bit patterns occurs frequently.

Dictionary compressors typically fall into two classes, those based on the (Lempel-Ziv) LZ77 compression algorithm and those based on the LZ78 compression algorithm. The LZ77 compression algorithm operates by examining messages one by one, locating identical sequences of messages backwards in time in the ensemble. When a match is found, a new message is inserted into a compressed ensemble in place of the repeating messages. The new message indicates the distance or offset backwards in the compressed ensemble as well as the number of messages that have been found to repeat (the length).

Depending on the application, the LZ77 compression algorithm can have a number of drawbacks. For example, each newly added message in the compressed ensemble requires two pieces of information, a distance or offset and length. Also, the compressor and decompressor must search backwards through the compressed sequence to locate cases where the pattern repeats. Such searching requires that the compressor and decompressor maintain an image of the entire compressed sequence up to the last received message in the compressed ensemble. Typically, such an image is not maintained; instead, a sliding window (e.g., 4 k in length) is maintained for both the compressor and decompressor.

To overcome these issues, the LZ78 compression algorithm was proposed. The LZ78 compression algorithm maintains a dictionary of previously seen sequences of messages in the original ensemble. As the compressor walks through the ensemble, the ensemble is broken down into distinct sequences made up of an already seen sequence of messages followed by the first message that would make the sequence non-repeating. The resulting compressed sequence is represented by tuples made up of an index into the dictionary for the repeating part of the sequence followed by the message that makes the sequence non-repeating.

An improvement to the LZ78 compression algorithm, called LZW (Lempel-Ziv-Welch), subsequently was proposed. The LZW compression algorithm varies from the LZ78 compression algorithm in that the dictionary is preloaded with all the messages in the alphabet associated with the ensemble. The compressor and decompressor can then infer the dictionary entries based on the previous entries in the original ensemble, and therefore do not need to include both the dictionary entry and the next unique message in the output ensemble.

The LZW compression algorithm is a modification of the LZ78 compression algorithm. Both compression algorithms store entries in the dictionary in the form of 1) input messages that made the previous output message non-repeating and 2) the new input message. The primary difference between the LZ78 compression algorithm and the LZW compression algorithm is that the LZW compression algorithm can infer the dictionary from the input sequence during compression and from the compressed sequence during decompression.

Despite the development of the LZW compression algorithm, there is a need for an output-driven dictionary compression method that has many of the traditional features of the LZW compression algorithm, but, unlike the LZW compression algorithm, is not based on either the LZ77 compression algorithm or the LZ78 compression algorithm.

SUMMARY OF THE INVENTION

The invention is embodied in a data compression method and apparatus that is not based on either the LZ77 compression algorithm or the LZ78 compression algorithm, but includes many features of the LZW compression algorithm. The inventive data compression method includes creating a mapping table of the messages in the alphabet of messages to a corresponding plurality of codewords, maintaining a dictionary including a mapping table of a first codeword and a second codeword to a new codeword, reading an input ensemble including a plurality of messages, converting the messages to an input codeword using the mapping table, and outputting the converted codewords as an output ensemble of compressed data. Unlike conventional data compression methods, the dictionary is generated from the output ensemble only, and is not based on any input sequences. Therefore, the dictionary more quickly builds to define longer sequences of messages compared to conventional data compression methods. Also, compared to conventional compression algorithms, decompressing data compressed by the compression methods and apparatus according to embodiments of the invention is relatively simple and fast, thus making compression according to embodiments of the invention suitable for use in systems that require a relatively compact and fast decompressor. Moreover, for ensembles with skewed distributions, i.e., ensembles containing a relatively small subset of distinct messages with a much higher probability of occurrence, the compression methods and apparatus according to embodiments of the invention can perform more efficiently than many conventional compression methods.

BRIEF DESCRIPTION OF THE DRAWINGS

FIG. 3 is a table showing the operation of the methods and apparatus for compressing for compressing data according to embodiments of the invention;

FIG. 5 is a flow chart of a method for decompressing data that was compressed using data compression methods according to embodiments of the invention.

DETAILED DESCRIPTION OF EXEMPLARY EMBODIMENTS

Figure 1:
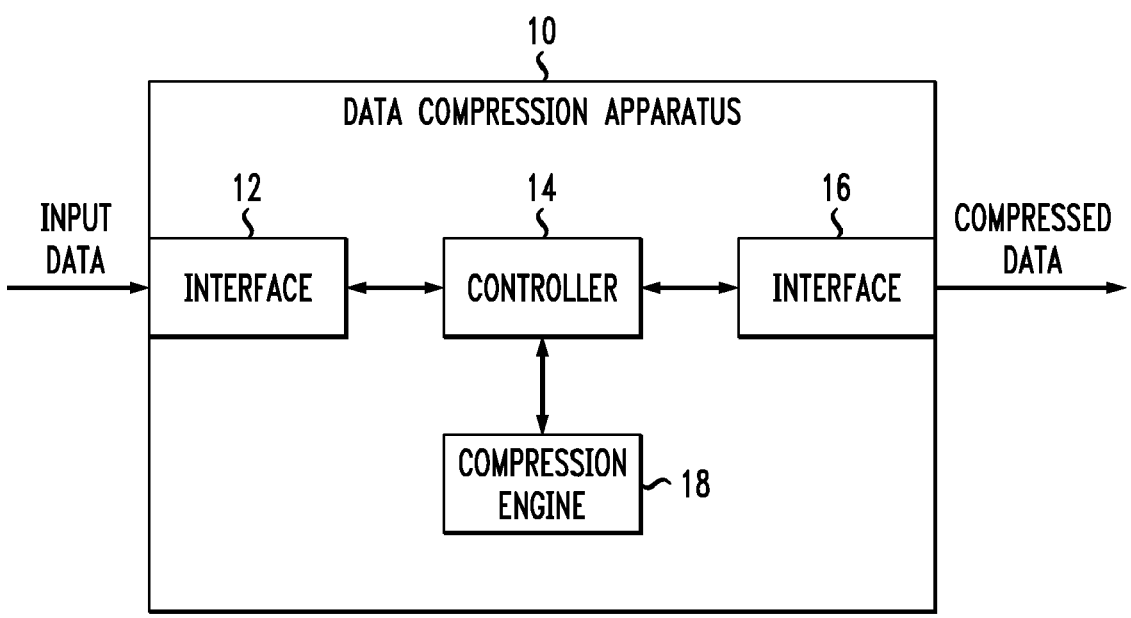
FIG. 1 is a schematic view of an apparatus for compressing data according to embodiments of the invention.

In the following description, like reference numerals indicate like components to enhance the understanding of the invention through the description of the drawings. Also, although specific features, configurations and arrangements are discussed hereinbelow, it should be understood that such is done for illustrative purposes only. A person skilled in the relevant art will recognize that other steps, configurations and arrangements are useful without departing from the spirit and scope of the invention.

The data compression methods and apparatus according to embodiments of the invention have many of the traditional features of the LZW compression algorithm, but, unlike the LZW compression algorithm, is not based on either the LZ77 compression algorithm or the LZ78 compression algorithm. For example, the data compression methods and apparatus according to embodiments of the invention construct each output message only from previous output messages, unlike conventional LZ compression methods, whose output messages include and are based on the previous output message and the most recent input message. In this manner, the dictionary used in the data compression methods and apparatus according to embodiments of the invention gets built more quickly to define relatively long sequences of messages compared to conventional LZ compression methods.

Referring now to FIG. 1, shown is a schematic view of an apparatus 10 for compressing data according to embodiments of the invention. The apparatus 10 includes an input interface 12, a controller 14 coupled to the input interface 12, an output interface 16 coupled to the controller 14, and a compression engine 18 included in or coupled to the controller 14. Data to be compressed is input or applied to the input interface 12 as a stream of information typically defined as an ensemble or input ensemble. An ensemble contains one or more distinct messages, with all distinct messages in an ensemble typically referred to or defined as the alphabet of the ensemble. The controller 14 uses the compression engine 18 to compress the ensemble into a stream of corresponding compressed codes that are delivered or applied to the output interface 16 as an output ensemble. The apparatus 10 can be used as part of a data transmission and/or storage system. In such case, the apparatus 10 can be or be part of a data write device that writes data to a data storage device coupled to the output interface 16. Such system typically includes a decompressor or decompression apparatus, such as a data read device that reads data stored in the data storage device.

The apparatus 10 can be comprised partially or completely of any suitable structure or arrangement, e.g., one or more integrated circuits. Also, it should be understood that the apparatus 10 includes other components, hardware and software (not shown) that are used for the operation of other features and functions of the apparatus 10 not specifically described herein. All relevant portions of the apparatus 10 can be partially or completely configured in the form of hardware circuitry and/or other hardware components within a larger device or group of components. Alternatively, all relevant portions of the apparatus 10 can be partially or completely configured in the form of software, e.g., as processing instructions and/or one or more sets of logic or computer code. In such configuration, the logic or processing instructions typically are stored in a memory element or a data storage device. The data storage device typically is coupled to a processor or controller, e.g., the controller 14. The controller accesses the necessary instructions from the data storage element and executes the instructions or transfers the instructions to the appropriate location within the apparatus 10.

As discussed hereinabove, and as will be described in greater detail hereinbelow, the data compression apparatus 10 and its compression engine 18 are configured in such a way that each output message is constructed only from other output messages, rather than from one or more previous output messages and the last input message, as in many conventional compressors. Such configuration of the data compression apparatus 10 and its compression engine 18 is advantageous because the dictionary builds to define long sequences of messages more quickly than the dictionary would in many conventional compression methods.

Figure 2:
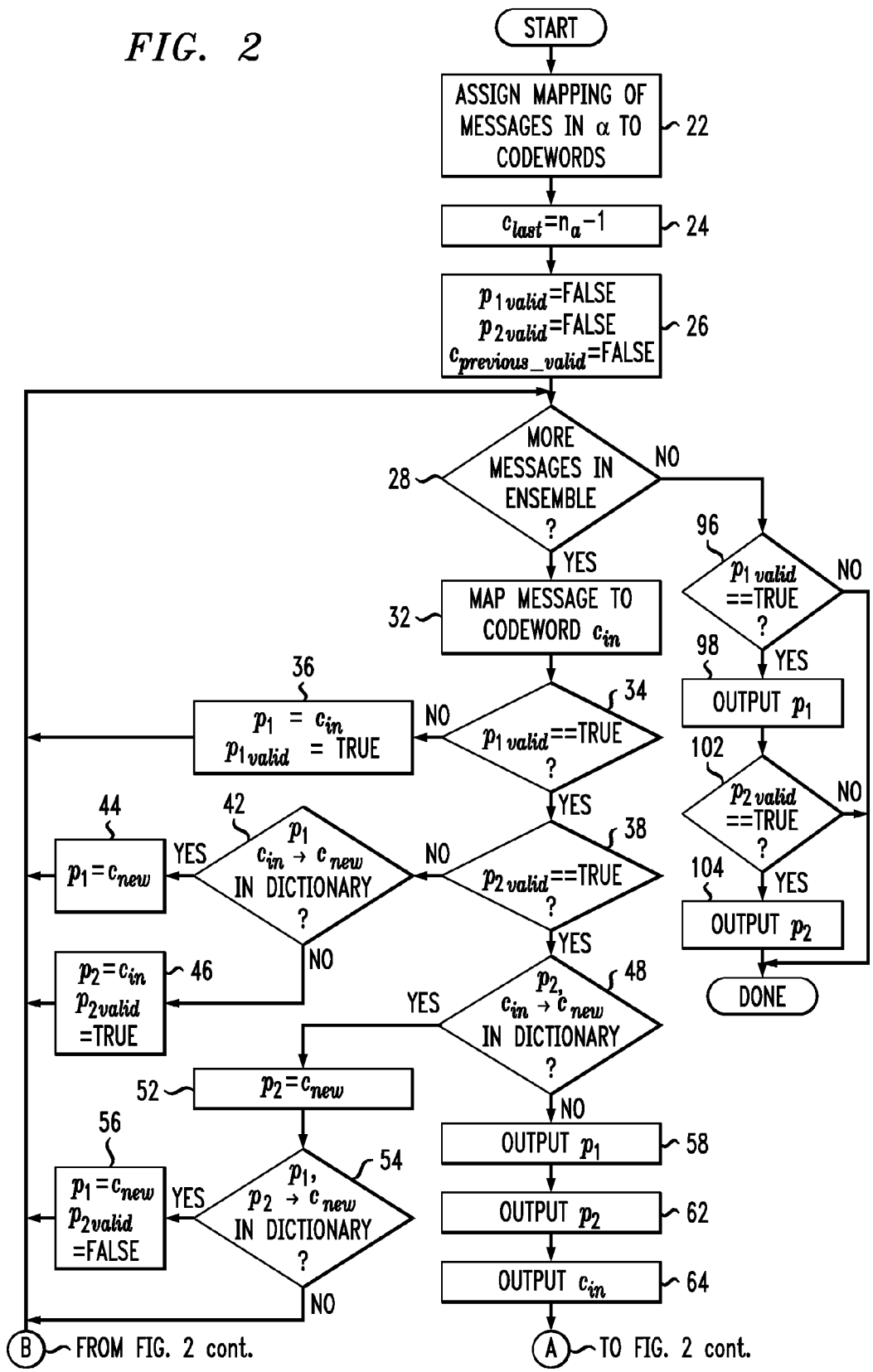
FIG. 2 is a flow chart of a method for compressing data according to embodiments of the invention.
Figure 2:
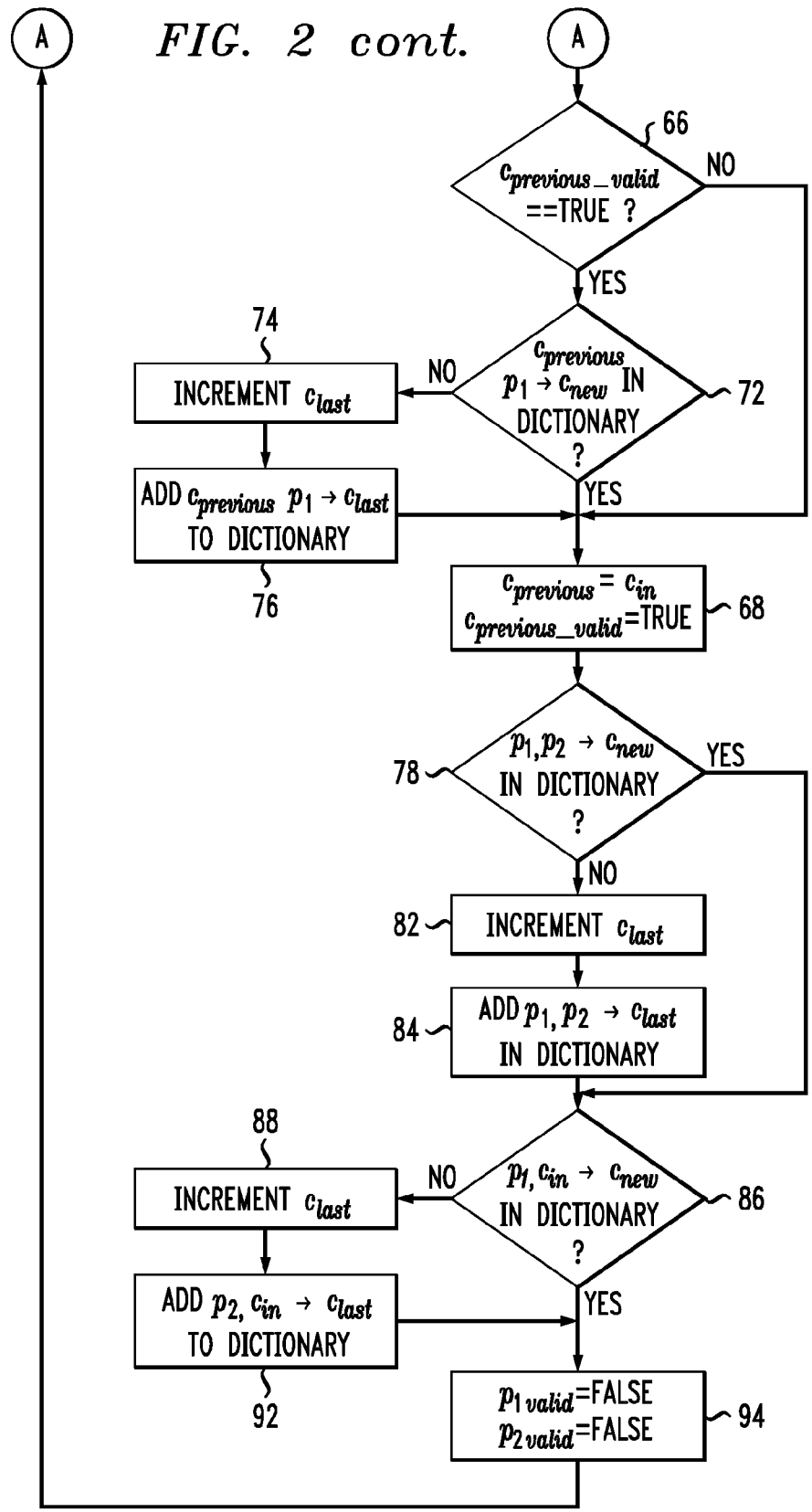

Referring now to FIG. 2, with continuing reference to FIG. 1, shown is a flow chart of a method 20 for compressing data according to embodiments of the invention. The method 20 typically is performed by the compression engine 18 and/or other appropriate components within the data compression apparatus 10, such as the controller 14. The data compression apparatus 10 falls into the category of dictionary compressors, which, as discussed hereinabove, operate by combining groups of codewords together into new codewords to create a new representation of the ensemble with higher information entropy and shorter length. That is, a source ensemble or stream containing messages (e.g., data characters) in an alphabet ($\alpha$) of messages is mapped to a set of codewords using a one-to-one mapping. The resulting sequence of codewords are then remapped into a new set of codewords with higher information entropy and shorter length. Groups of previously encountered codewords derived directly from messages in the source ensemble are substituted with a new codeword representing the message. These new codewords are defined during the compression process.

Before any compression of the input ensemble begins, the method 20 performs a step 22 of assigning a mapping of messages in the alphabet ($\alpha$) of the input ensemble to codewords. The codewords in this mapping take on numerical values ranging from 0 to $n_\alpha - 1$, where $n_\alpha$ is the number of messages in the alphabet ($\alpha$) of the input ensemble, i.e., the number of distinct messages in the input ensemble. Also, an initialization step 24 is performed, in which $c_{last}$ is initialized to the value of the number of messages ($n_\alpha$) in the alphabet of the input ensemble.

According to the method 20, a dictionary is maintained that includes a mapping of tuples of codewords ($c_1$, $c_2$) to a new codeword ($c_{new}$), i.e., $c_1$, $c_2 \rightarrow c_{new}$, as will be shown in subsequent steps of the method 20. Also, new codewords are assigned, in order, starting from $c_{last}+1$, where $c_{last}$ is the last assigned codeword in the source alphabet ($\alpha$), as will be shown in subsequent steps of the method 20. Unlike conventional data compression methods, in the method 20, the two codewords $c_1$ and $c_2$ are previous output codewords, and therefore the mapping or construction of the new codeword $c_{new}$ is based only on output codewords, not from codewords derived directly from any previous input messages.

According to the method 20, two working variables ($p_1$ and $p_2$) are maintained, along with a status to indicate if $p_1$ is valid, if $p_1$ and $p_2$ are valid, or if neither $p_1$ nor $p_2$ are valid, as will be shown in subsequent steps of the method 20. Also, according to the method 20, a variable $c_{previous}$ is used to keep track of the last output codeword, as will be shown in subsequent steps of the method 20. Prior to the beginning of any compression of the input ensemble, the method 20 performs an initialization step 26, in which the first working variable $p_1$ is initialized as invalid ($p_{1valid}$=false), the second working variable $p_2$ is initialized as invalid ($p_{2valid}$=false), and the variable $c_{previous}$ is marked or initialized as invalid or undefined ($c_{previous\,valid}$=false).

The method 20 includes a decision step 28 of determining whether there are any more messages in the input ensemble to be processed. In general, the method 20 continues until all messages in the input ensemble have been processed. According to the method 20, for each received message, the input message is converted to a codeword, $c_{in}$, using a one-to-one correspondence between input messages and codewords defined in the assigning step 22. That is, if the decision step 28 determines that there are more messages to process, a step 32 of converting the input message to a codeword $c_{in}$ is performed.

The method 20 also includes a decision step 34 of determining whether the working variable $p_1$ is valid ($p_{1valid}$=true). If $p_1$ is invalid, the method 20 performs a step 36 of assigning $p_1$ the value of the codeword $c_{in}$ ($p_1=c_{in}$) and the status of $p_1$ is marked as valid ($p_{1valid}$=true). The method 20 then returns to the decision step 28 of determining whether there are any more messages in the input ensemble to be processed.

The method 20 includes another decision step 38 of determining whether the working variable $p_2$ is valid ($p_{2valid}$=true). If $p_1$ is valid, but $p_2$ is invalid, the method 20 performs another decision step 42 of determining whether a codeword $c_{new}$ mapped from the variable $p_1$ and the codeword $c_{in}$ ($p_1,c_{in} \rightarrow c_{new}$) exists in the dictionary. If the codeword $p_1,c_{in} \rightarrow c_{new}$ exists in the dictionary, the method 20 performs a step 44 of assigning $p_1$ the value of the codeword $c_{new}$ ($p_1=c_{new}$) and the method 20 then returns to the decision step 28 of determining whether there are any more messages in the input ensemble to be processed. If the codeword $p_1,c_{in} \rightarrow c_{new}$ does not exist in the dictionary, the method 20 performs a step 46 of assigning $p_2$ the value of the codeword $c_{in}$ ($p_2=c_{in}$) and the status of $p_2$ is marked as valid ($p_{2valid}$=true). The method 20 then returns to the decision step 28 of determining whether there are any more messages in the input ensemble to be processed.

The method 20 includes another decision step 48 of determining whether the a codeword $c_{new}$ mapped from the variable $p_2$ and the codeword $c_{in}$ ($p_2,c_{in} \rightarrow c_{new}$) exists in the dictionary. If $p_1$ is valid and $p_2$ is valid, the method 20 performs the decision step 48 to determine whether the codeword $p_2,c_{in} \rightarrow c_{new}$ exists in the dictionary. If the codeword $p_2,c_{in} \rightarrow c_{new}$ exists in the dictionary, the method 20 performs a step 52 of assigning $p_2$ the value of the codeword $c_{new}$ ($p_2=c_{new}$). The method 20 then performs another decision step 54 of determining whether a codeword $c_{new}$ mapped from the variable $p_1$ and the variable $p_2$ ($p_1,p_2 \rightarrow c_{new}$) exists in the dictionary. If the codeword $p_1,p_2 \rightarrow c_{new}$ exists in the dictionary, the method 20 performs a step 56 of assigning $p_1$ the value of the codeword $c_{new}$ ($p_1=c_{new}$) and the status of $p_2$ is marked as invalid ($p_{2valid}$=false). The method 20 then returns to the decision step 28 of determining whether there are any more messages in the input ensemble to be processed. If the codeword $p_1,p_2 \rightarrow c_{new}$ does not exist in the dictionary, the method 20 returns to the decision step 28 of determining whether there are any more messages in the input ensemble to be processed.

Returning to the decision step 48 of determining whether the new codeword $p_2,c_{in} \rightarrow c_{new}$ exists in the dictionary. If the new codeword $p_2,c_{in} \rightarrow c_{new}$ does not exist in the dictionary, the method 20 performs a step 58 of outputting $p_1$, a step 62 of outputting $p_2$, and a step 64 of outputting $c_{in}$.

The method 20 then performs another decision step 66 of determining whether the variable $c_{previous}$ exists, i.e., if the variable $c_{previous}$ is valid or defined ($c_{previous\,valid}$=true). If the variable $c_{previous}$ does not exist (i.e., is invalid or undefined), the method 20 performs a step 68 of assigning $c_{previous}$ the value of the codeword $c_{in}$ ($c_{previous}=c_{in}$). As a result of the assigning step 68, the variable $c_{previous}$ now exists, i.e., is valid or defined. If the variable $c_{previous}$ does exist (i.e., is valid or defined), the method 20 performs another decision step 72 of determining whether a codeword $c_{new}$ mapped from the variable $c_{previous}$ and the variable $p_1$ ($c_{previous},p_1 \rightarrow c_{new}$) exists in the dictionary.

If a codeword $c_{previous},p_1 \rightarrow c_{new}$ does not exist in the dictionary, the method 20 performs a step 74 of incrementing the last assigned codeword $c_{last}$ by 1 ($c_{last}=c_{last}+1$) and a step 76 of adding the last assigned codeword $c_{last}$ mapped from the variable $c_{previous}$ and the variable $p_1$ ($c_{previous},p_1 \rightarrow c_{last}$) to the dictionary. The method then performs the step 68 of assigning $c_{previous}$ the value of the codeword $c_{in}$ ($c_{previous}=c_{in}$), as discussed hereinabove. If the codeword $c_{previous},p_1 \rightarrow c_{new}$ already exists in the dictionary, the method 20 performs the assigning step 68 without first performing the incrementing step 74 and the adding step 76.

The method 20 then performs another decision step 78 of determining whether a codeword $c_{new}$ mapped from the variable $p_1$ and the variable $p_2$ ($p_1,p_2 \rightarrow c_{new}$) exists in the dictionary. If the codeword $c_{new}$ does not exist in the dictionary, the method 20 performs the step 82 of incrementing the last assigned codeword $c_{last}$ by 1 ($c_{last}=c_{last}+1$) and a step 84 of adding the last assigned codeword $c_{last}$ mapped from the variable $p_1$ and the variable $p_2$ ($p_1,p_2 \rightarrow c_{last}$) to the dictionary. The method 20 then performs another decision step 86 of determining whether a codeword $c_{new}$ mapped from the variable $p_2$ and the variable $c_{in}$ ($p_2,c_{in} \rightarrow c_{new}$) exists in the dictionary. If the codeword $c_{new}$ does exist in the dictionary, the method 20 performs the decision step 86 without first performing the incrementing step 82 and the adding step 84.

With respect to the decision step 86, if the codeword $c_{new}$ does not exist in the dictionary, the method 20 performs the step 88 of incrementing the last assigned codeword $c_{last}$ by 1 ($c_{last}=c_{last}+1$) and a step 92 of adding the last assigned codeword $c_{last}$ mapped from the variable $p_2$ and the variable $c_{in}$ ($p_2,c_{in} \rightarrow c_{last}$) to the dictionary, followed by a step 94 of marking the status of the variable $p_1$ as invalid ($p_{1valid}$=false) and marking the status of the variable $p_2$ as invalid ($p_{2valid}$=false). If the codeword $c_{new}$ does exist in the dictionary, the method 20 performs the step 94 without performing steps 88 and 92. The method 20 then returns to the decision step 28.

Returning to the decision step 28, if there are no more messages in the input ensemble to be processed, the method 20 flushes out the data compression apparatus 10 and its compression engine 18 by outputting the variable $p_1$ and the variable $p_2$ as the final two codewords, if they are valid. More specifically, the method 20 performs another decision step 96 of determining whether the variable $p_1$ is valid ($p_{1\,valid}$=true). If the variable $p_1$ is invalid, the method 20 ends. If the variable $p_1$ is valid, the method 20 performs a step 98 of outputting the variable $p_1$. The method 20 then performs another decision step 102 of determining whether the variable $p_2$ is valid ($p_{2\,valid}$=true). If the variable $p_2$ is invalid, the method 20 ends. If the variable $p_2$ is valid, the method 20 performs a step 104 of outputting the variable $p_2$, and then the method 20 ends.

In this manner, the data compression method 20 converts an input ensemble that was input to the input interface 12 of the data compression apparatus 10 into a compressed, output ensemble that is output from the output interface 16 of the data compression apparatus 10.

Referring now to FIG. 3, shown is a table showing the operation of the data compression method 20, as just described, using a sample input ensemble. The table shows the values of the input codewords $c_{in}$, the first working variable $p_1$, the second working variable $p_2$, and the output codewords $c_{out}$ as the data compression method 20 processes the messages of the input ensemble. The table also shows the relevant dictionary activity as the method 20 processes the messages of the input ensemble.

Figure 4:
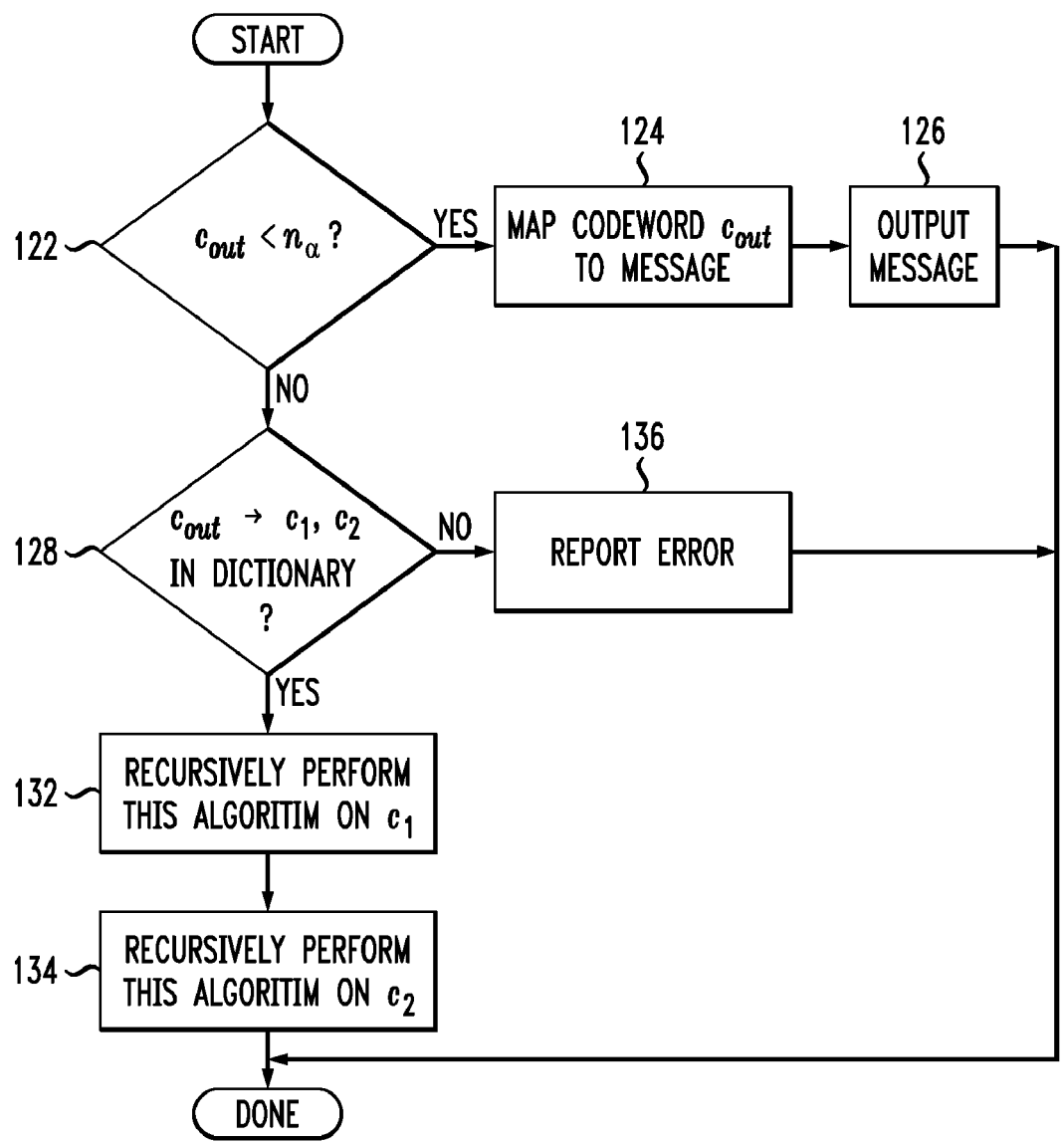
FIG. 4 is a flow chart of a method for resolving the messages in the source ensemble given a codeword.

Referring to FIG. 4, shown is a flow chart of a method 120 for resolving the messages in the source ensemble given a codeword. Also, referring now to FIG. 5, with continuing reference to FIG. 4, shown is a flow chart of a method 140 for decompressing data that was compressed according to embodiments of the invention, e.g., using the data compression apparatus 10 and the data compression method 20 described hereinabove. The decompression method 140 uses the recursive technique or algorithm shown in the method 120 to perform the decompression. The recursive technique or algorithm converts a compressed codeword back into one or more codewords that can be remapped using a one-to-one mapping to the ensemble. By recursively unwrapping each codeword, codewords that map directly to the original messages in the uncompressed ensemble can be obtained.

Before any decompression begins of the compressed (output) ensemble that was output from the data compression apparatus 10, the method 140 performs a step 141 of assigning a mapping of messages in the alphabet ($\alpha$) to codewords 0 through $n_\alpha$−1, where $n_\alpha$ is the number of messages in the alphabet ($\alpha$) of the original input ensemble. Also, the mapping created by the data decompression method 140 must match the mapping used by the data compression method 20 performed by the data compression apparatus 10.

According to the data decompression method 140, a dictionary is maintained that includes a mapping of a single codeword ($c_{out}$) to two more fundamental codewords ($c_1$, $c_2$), i.e., $c_{out} \rightarrow c_1, c_2$, as will be shown in subsequent steps of the data decompression method 140. Also, like the data compression method 20, in the data decompression method 140, new codewords are assigned, in order, starting from $c_{last}$+1, where $c_{last}$ is the last assigned codeword, as will be shown in subsequent steps of the data decompression method 140. The data decompression method 140 performs a step 142, in which codeword $c_{last}$ is initialized to $n_\alpha$−1 before the data decompression begins. Also, the data decompression method 140 maintains a previously received codeword, $c_{previous}$, along with a status to indicate if the previously received codeword $c_{previous}$ is valid or invalid.

The method 120 includes a decision step 122 of determining whether the codeword $c_{out}$ maps to a message in the alphabet ($\alpha$) of the original input ensemble. If the codeword $c_{out}$ does map to a message in the alphabet of the original input ensemble (i.e., if $c_{out} < n_\alpha$), the method 120 performs a step 124 of converting the codeword $c_{out}$ to its associated message, and a step 126 of outputting the message to which the codeword $c_{out}$ was converted. After performing the outputting step 126, the method 120 is done with this particular recursion.

If the codeword $c_{out}$ does not map to a message in the alphabet of the output ensemble (i.e., if $c_{out} > n_\alpha$), the method 120 performs a decision step 128 of determining whether the codeword $c_{out}$ mapped from a fundamental codeword $c_1$ and a fundamental codeword $c_2$ ($c_{out} \rightarrow c_1, c_2$) exists in the dictionary. If the codeword $c_{out}$ does exist in the dictionary, the method 120 performs a step 132 of resolving $c_1$ by performing a recursive technique or algorithm on the codeword $c_1$ by applying the method 120 on $c_1$. The method 120 then performs a step 134 of resolving $c_2$ by performing the same recursive technique or algorithm on the codeword $c_2$ by applying the method 120 on $c_2$. If the codeword $c_{out}$ does not exist in the dictionary, the method 120 performs a step 136 of reporting an error, and the method 120 then is done with this particular recursion.

Before performing the recursive algorithm shown in FIG. 4 on the particular codeword $c_{out}$ of interest, the dictionary must be updated. The method 140 performs an initialization step 143 in which the variable $c_{previous}$ is marked or initialized as invalid or undefined ($c_{previous\,valid}$=false). The method 140 includes a decision step 144 of determining whether there are any more codewords in the compressed (output) ensemble to be processed (i.e., decompressed). The method 144 processes all codewords in the compressed ensemble, therefore, if there are no more codewords to process, the method 140 is done.

According to the method 140, for each codeword, the method 140 performs a decision step 146 of determining whether the variable $c_{previous}$ is valid ($c_{previous\,valid}$=true). If the variable $c_{previous}$ is valid, the method 140 performs a decision step 148 of determining whether the dictionary contains an entry for a tuple combining codewords $c_{previous}$ and $c_{out}$ ($c \rightarrow c_{previous}, c_{out}$). If an entry $c \rightarrow c_{previous}, c_{out}$ does not exist in the dictionary, the method 140 performs a step 152 of incrementing $c_{last}$ ($c_{last}=c_{last}$+1) and a step 154 of adding $c_{last} \rightarrow c_{previous}, c_{out}$ to the dictionary. The method 140 then performs a step 156 of assigning the value of $c_{previous}$ the value of $c_{out}$ ($c_{previous}=c_{out}$) and marking the status of $c_{previous\,valid}$ as valid ($c_{previous\,valid}$=true).

If the decision step 148 determines that $c \rightarrow c_{previous}, c_{out}$ does exist in the dictionary, the method 140 performs the assigning and marking step 156 directly, i.e., without first performing the incrementing step 152 and the adding step 154. If the decision step 146 determines that the variable $c_{previous}$ is invalid ($c_{previous\,valid}$=false), the method 140 performs the assigning and marking step 156 directly, i.e., without first performing the decision step 148.

The method 140 then performs a step 158 of performing a recursive decompression of the codeword $c_{out}$, as discussed hereinabove, using the method 120. The method 140 then returns to the decision step 144. Returning to the decision step 144, if there are no more codewords available to be processed (e.g., for decompression), the method 140 is done.

As discussed hereinabove, the data compression methods described herein include a dictionary that is generated only from the output ensemble. Each of the dictionary entries map previous output values to new dictionary entries rather than the previous output and input codewords. This compares with conventional data compression methods, such as LZW-based data compression methods, whose dictionary entries are based on a combination of the previous output codeword and the next input codeword, such as the codeword associated with the new input messages and the output codeword from the previous sequence of input messages. According to embodiments of the invention, by using only the output ensemble to generate dictionary entries, the dictionary is build more quickly to define longer sequences of messages compared to conventional data compression methods. Also, for ensembles with skewed distributions, the compression methods and apparatus according to embodiments of the invention can perform more efficiently than many conventional compression methods. With respect to decompression, compared to conventional decompression algorithms, decompressing data compressed by the compression methods and apparatus according to embodiments of the invention is relatively simple and fast, thus making compression according to embodiments of the invention suitable for use in systems that require a relatively compact and fast decompressor.

It will be apparent to those skilled in the art that many changes and substitutions can be made to the embodiments of the invention herein described without departing from the spirit and scope of the invention as defined by the appended claims and their full scope of equivalents.

The invention claimed is:

1. A method for compressing an input ensemble of a plurality of messages from an alphabet of messages into a compressed output ensemble, the method comprising the steps of:
   assigning a mapping of the messages in the alphabet of messages to a plurality of codewords to create a mapping table;
   maintaining a dictionary of codewords generated from the mapping of two output codewords;
   reading the input ensemble of messages;
   converting each read message to an input codeword ($c_{in}$) based on the mapping table, wherein the converting step includes converting each read message to an input codeword based on the dictionary codewords; and
   outputting the converted codewords as a compressed output ensemble,
   wherein each output codeword is constructed only from one or more previously constructed output codewords.

2. The method as recited in claim 1, further comprising the step of maintaining a validity status of a first variable ($p_1$) and a second variable ($p_2$), and wherein codewords are added to the dictionary of codewords based on whether the input codeword exists in the dictionary and based on the validity status of at least one of the first variable and the second variable.

3. The method as recited in claim 1, further comprising the step of maintaining a validity status of a first variable ($p_1$) and a second variable ($p_2$), and wherein the validity status of at least one of the first and second variables is based on whether a codeword constructed from at least one of the first and second variables exists in the dictionary.

4. The method as recited in claim 1, further comprising a step of maintaining a dictionary including a mapping of a first codeword ($c_1$) and a second codeword ($c_2$) to a third codeword ($c_{new}$), wherein the first codeword ($c_1$) and the second codeword ($c_2$) are previous output codewords, and wherein the converting step includes converting each read message to an input codeword ($c_{in}$) based on the dictionary codewords.

5. The method as recited in claim 1, wherein the assigning step includes assigning a mapping of the messages in the alphabet of messages to a first plurality of codewords using a one-to-one mapping, and wherein the converting step includes remapping at least a portion of the first plurality of codewords into a second plurality of codewords, wherein the second plurality of codewords has a greater information entropy than the first plurality of codewords, and wherein the second plurality of codewords has a shorter length than the first plurality of codewords.

6. The method as recited in claim 1, further comprising the step of maintaining a validity status of a first variable ($p_1$) and a second variable ($p_2$),
   wherein, if the first variable is invalid, then
      assigning the first variable the value of the input codeword,
      marking the first variable as valid, and
      processing the next message,
   wherein, if the first variable is valid and the second variable is invalid, then
      if the third codeword mapped by the first variable and the input codeword exists in the dictionary,
         assigning the first variable the value of the third codeword, otherwise,
         assigning the second variable the value of the input codeword, and
         marking the second variable as valid, and
      independent or whether the third codeword mapped by the first variable and the input codeword exists in the dictionary, processing the next message,
   wherein, if the first variable is valid and the second variable is valid, then
      if the third codeword mapped by the second variable and the input codeword exists in the dictionary,
         assigning the second variable the value of the third codeword,
         if the third codeword mapped by the first variable and the newly assigned second variable exists in the dictionary,
            assigning the first variable the value of the third codeword,
            and
            marking the second variable as invalid,
         independent or whether the third codeword mapped by the first variable and the newly assigned second variable exists in the dictionary, processing the next message,
      otherwise if the third codeword mapped by the second variable and the input codeword does not exist in the dictionary,
         output the value of the first variable as the next output codeword,
         output the value of the second variable as the next output codeword,
         output the value of the input codeword as the next output codeword,
         if the third codeword mapped by the last output codeword and the first variable does not exist in the dictionary,
            incrementing the third codeword, and
            adding the third codeword mapped by the last output codeword and the first variable to the dictionary,
         in either case, assigning the last output codeword the value of the input codeword,
         if the third codeword mapped by the first variable and the second variable does not exist in the dictionary,
            incrementing the third codeword, and
            adding the third codeword mapped by the first variable and the second variable to the dictionary,
         in either case, if the third codeword mapped by the second variable and the input codeword does not exist in the dictionary,
            incrementing the third codeword, and
            adding the third codeword mapped by the second variable and the input codeword to the dictionary, in either case, marking the first variable as invalid, and
marking the second variable as invalid, and
processing the next message,
if all messages in the input ensemble have been processed
if the first variable is valid,
outputting the value of the first variable as the next output codeword, and
in either case, if the second variable is valid,
outputting the value of the second variable as the last output codeword.

7. An apparatus for compressing an input ensemble of a plurality of messages from an alphabet of messages into a compressed output ensemble, the apparatus comprising:
an input interface for receiving the input ensemble plurality of messages;
a controller coupled to the input interface, wherein the controller includes a compression engine configured to compress the input ensemble into a compressed output ensemble; and
an output interface coupled to the controller for transmitting the compressed output ensemble from the apparatus,
wherein the controller is configured to assign a mapping of the messages in the alphabet of messages to a plurality of codewords to create a mapping table,
wherein the controller is configured to read the input ensemble of messages,
wherein the controller is configured to convert each read message to an input codeword ($c_{in}$) based on the mapping table, and
wherein the controller is configured to output the converted codewords as a compressed output ensemble, wherein each output codeword is constructed from one or more previously constructed output codewords.

8. The apparatus as recited in claim 7, wherein the controller is configured to maintain a dictionary of codewords generated from the mapping of two output codewords, and wherein the converting step includes converting each read message to an input codeword based on the dictionary codewords.

9. The apparatus as recited in claim 8, wherein the controller is configured to maintain a validity status of a first variable ($p_1$) and a second variable ($p_2$), and wherein codewords are added to the dictionary of codewords based on whether the input codeword exists in the dictionary and based on the validity status of at least one of the first variable and the second variable.

10. The apparatus as recited in claim 8, wherein the controller is configured to maintain a validity status of a first variable ($p_1$) and a second variable ($p_2$), and wherein the validity status of at least one of the first and second variables is based on whether a codeword constructed from at least one of the first and second variables exists in the dictionary.

11. The apparatus as recited in claim 7, wherein the controller is configured to maintain a dictionary including a mapping of a first codeword ($c_1$) and a second codeword ($c_2$) to a third codeword ($c_{new}$), wherein the first codeword ($c_1$) and the second codeword ($c_2$) are previous output codewords, and wherein the converting step includes converting each read message to an input codeword ($c_{in}$) based on the dictionary codewords.

12. The apparatus as recited in claim 7, wherein the controller is configured to assign the mapping of the messages in the alphabet of messages to the plurality of codewords to create the mapping table in such a way that the controller assigns a mapping of the messages in the alphabet of messages to a first plurality of codewords using a one-to-one mapping, and wherein the converting step includes remapping at least a portion of the first plurality of codewords into a second plurality of codewords, wherein the second plurality of codewords has a greater information entropy than the first plurality of codewords, and wherein the second plurality of codewords has a shorter length than the first plurality of codewords.

13. The apparatus as recited in claim 7, wherein the controller is configured to maintain a validity status of a first variable ($p_1$) and a second variable ($p_2$),
wherein, if the first variable is invalid, then
assigning the first variable the value of the input codeword,
marking the first variable as valid, and
processing the next message,
wherein, if the first variable is valid and the second variable is invalid, then
if the third codeword mapped by the first variable and the input codeword exists in the dictionary,
assigning the first variable the value of the third codeword, otherwise,
assigning the second variable the value of the input codeword, and
marking the second variable as valid, and
independent or whether the third codeword mapped by the first variable and the input codeword exists in the dictionary, processing the next message,
wherein, if the first variable is valid and the second variable is valid, then
if the third codeword mapped by the second variable and the input codeword exists in the dictionary,
assigning the second variable the value of the third codeword,
if the third codeword mapped by the first variable and the newly assigned second variable exists in the dictionary,
assigning the first variable the value of the third codeword, and
marking the second variable as invalid,
independent or whether the third codeword mapped by the first variable and the newly assigned second variable exists in the dictionary, processing the next message,
otherwise if the third codeword mapped by the second variable and the input codeword does not exist in the dictionary,
output the value of the first variable as the next output codeword,
output the value of the second variable as the next output codeword,
output the value of the input codeword as the next output codeword,
if the third codeword mapped by the last output codeword and the first variable does not exist in the dictionary,
incrementing the third codeword, and
adding the third codeword mapped by the last output codeword and the first variable to the dictionary,
in either case, assigning the last output codeword the value of the input codeword,
if the third codeword mapped by the first variable and the second variable does not exist in the dictionary,
incrementing the third codeword, and
adding the third codeword mapped by the first variable and the second variable to the dictionary, in either case, if the third codeword mapped by the second variable and the input codeword does not exist in the dictionary,
incrementing the third codeword, and
adding the third codeword mapped by the second variable and the input codeword to the dictionary,
in either case, marking the first variable as invalid, and marking the second variable as invalid, and processing the next message,
if all messages in the input ensemble have been processed
if the first variable is valid,
outputting the value of the first variable as the next output codeword, and
in either case, if the second variable is valid,
outputting the value of the second variable as the last output codeword.

14. A method for compressing an input ensemble of a plurality messages from an alphabet of messages into a compressed output ensemble, the method comprising the steps of:
assigning a mapping of the messages in the alphabet of messages to a plurality of codewords to create a mapping table;
maintaining a dictionary including a mapping of a first codeword ($c_1$) and a second codeword ($c_2$) to a third codeword ($c_{new}$), wherein the first codeword ($c_1$) and the second codeword ($c_2$) are previous output codewords;
maintaining a validity status of a first working variable ($p_1$) and a second working variable ($p_2$);
reading the input ensemble of messages; and
converting each read message to an input codeword ($C_{in}$) based on the mapping table and the dictionary,
wherein, if the first variable is invalid, then
assigning the first variable the value of the input codeword,
marking the first variable as valid, and
processing the next message,
wherein, if the first variable is valid and the second variable is invalid, then
if the third codeword mapped by the first variable and the input codeword exists in the dictionary,
assigning the first variable the value of the third codeword, otherwise,
assigning the second variable the value of the input codeword, and
marking the second variable as valid, and
independent or whether the third codeword mapped by the first variable and the input codeword exists in the dictionary, processing the next message,
wherein, if the first variable is valid and the second variable is valid, then
if the third codeword mapped by the second variable and the input codeword exists in the dictionary,
assigning the second variable the value of the third codeword,
if the third codeword mapped by the first variable and the newly assigned second variable exists in the dictionary,
assigning the first variable the value of the third codeword, and
marking the second variable as invalid,
independent or whether the third codeword mapped by the first variable and the newly assigned second variable exists in the dictionary, processing the next message,
otherwise if the third codeword mapped by the second variable and the input codeword does not exist in the dictionary,
output the value of the first variable as the next output codeword,
output the value of the second variable as the next output codeword,
output the value of the input codeword as the next output codeword,
if the third codeword mapped by the last output codeword and the first variable does not exist in the dictionary,
incrementing the third codeword, and
adding the third codeword mapped by the last output codeword and the first variable to the dictionary,
in either case, assigning the last output codeword the value of the input codeword,
if the third codeword mapped by the first variable and the second variable does not exist in the dictionary,
incrementing the third codeword, and
adding the third codeword mapped by the first variable and the second variable to the dictionary,
in either case, if the third codeword mapped by the second variable and the input codeword does not exist in the dictionary,
incrementing the third codeword, and
adding the third codeword mapped by the second variable and the input codeword to the dictionary,
in either case, marking the first variable as invalid, and marking the second variable as invalid, and processing the next message,
if all messages in the input ensemble have been processed
if the first variable is valid,
outputting the value of the first variable as the next output codeword, and
in either case, if the second variable is valid,
outputting the value of the second variable as the last output codeword.

15. A computer readable medium storing instructions that carry out a method for compressing an input ensemble of a plurality of messages from an alphabet of messages into a compressed output ensemble, the computer readable medium comprising:
instructions for assigning a mapping of the messages in the alphabet of messages to a plurality of codewords to create a mapping table;
instructions for maintaining a dictionary of codewords generated from the mapping of two output codewords;
instructions for reading the input ensemble of messages;
instructions for converting each read message to an input codeword ($c_{in}$) based on the mapping table, wherein the converting instructions include instructions for converting each read message to an input codeword based on the dictionary codewords; and
instructions for outputting the converted codewords as a compressed output ensemble,
wherein each output codeword is constructed only from one or more previously constructed output codewords.

16. The computer readable medium as recited in claim 15, further comprising instructions for maintaining a dictionary including a mapping of a first codeword ($c_1$) and a second codeword ($c_2$) to a third codeword ($c_{new}$), wherein the first codeword ($c_1$) and the second codeword ($c_2$) are previous output codewords, and wherein the converting step includes converting each read message to an input codeword ($c_{in}$) based on the dictionary codewords.

17. The computer readable medium as recited in claim 15, further comprising instructions for maintaining a validity status of a first variable ($p_1$) and a second variable ($p_2$),
   wherein, if the first variable is invalid, then
      assigning the first variable the value of the input codeword,
      marking the first variable as valid, and
      processing the next message,
   wherein, if the first variable is valid and the second variable is invalid, then
      if the third codeword mapped by the first variable and the input codeword exists in the dictionary,
         assigning the first variable the value of the third codeword, otherwise,
         assigning the second variable the value of the input codeword, and
         marking the second variable as valid, and
      independent or whether the third codeword mapped by the first variable and the input codeword exists in the dictionary, processing the next message,
   wherein, if the first variable is valid and the second variable is valid, then
      if the third codeword mapped by the second variable and the input codeword exists in the dictionary,
         assigning the second variable the value of the third codeword,
         if the third codeword mapped by the first variable and the newly assigned second variable exists in the dictionary,
            assigning the first variable the value of the third codeword, and
            marking the second variable as invalid,
         independent or whether the third codeword mapped by the first variable and the newly assigned second variable exists in the dictionary, processing the next message,
      otherwise if the third codeword mapped by the second variable and the input codeword does not exist in the dictionary,
         output the value of the first variable as the next output codeword,
         output the value of the second variable as the next output codeword,
         output the value of the input codeword as the next output codeword,
         if the third codeword mapped by the last output codeword and the first variable does not exist in the dictionary,
            incrementing the third codeword, and
            adding the third codeword mapped by the last output codeword and the first variable to the dictionary,
         in either case, assigning the last output codeword the value of the input codeword,
         if the third codeword mapped by the first variable and the second variable does not exist in the dictionary,
            incrementing the third codeword, and
            adding the third codeword mapped by the first variable and
            the second variable to the dictionary,
         in either case, if the third codeword mapped by the second variable and the input codeword does not exist in the dictionary,
            incrementing the third codeword, and
            adding the third codeword mapped by the second variable and the input codeword to the dictionary,
         in either case, marking the first variable as invalid, and
         marking the second variable as invalid, and
         processing the next message,
if all messages in the input ensemble have been processed
   if the first variable is valid,
      outputting the value of the first variable as the next output codeword, and
   in either case, if the second variable is valid,
      outputting the value of the second variable as the last output codeword.

\* \* \* \* \*